United States Patent
Miura et al.

(10) Patent No.: US 9,269,600 B2
(45) Date of Patent: Feb. 23, 2016

(54) ELECTROSTATIC CHUCK DEVICE

(75) Inventors: Yukio Miura, Tokyo (JP); Kazunori Ishimura, Tokyo (JP); Mamoru Kosakai, Tokyo (JP)

(73) Assignee: Sumitomo Osaka Cement Co., Ltd., Tokyo (JP)

( * ) Notice: Subject to any disclaimer, the term of this patent is extended or adjusted under 35 U.S.C. 154(b) by 142 days.

(21) Appl. No.: 14/113,765

(22) PCT Filed: Apr. 27, 2012

(86) PCT No.: PCT/JP2012/061402
§ 371 (c)(1),
(2), (4) Date: Oct. 24, 2013

(87) PCT Pub. No.: WO2012/147931
PCT Pub. Date: Nov. 1, 2012

(65) Prior Publication Data
US 2014/0042716 A1 Feb. 13, 2014

(30) Foreign Application Priority Data
Apr. 27, 2011 (JP) ................................ 2011-099982

(51) Int. Cl.
| H05B 3/68 | (2006.01) |
| H05B 3/06 | (2006.01) |
| H01L 21/683 | (2006.01) |
| H01L 21/67 | (2006.01) |

(52) U.S. Cl.
CPC ...... *H01L 21/6833* (2013.01); *H01L 21/67103* (2013.01); *H01L 21/6831* (2013.01); *Y10T 279/23* (2015.01)

(58) Field of Classification Search
CPC .................. H01L 21/67103; H01L 21/67109; H01L 21/6831; H01L 21/6833; Y10T 279/23
USPC ................. 219/444.1, 542–533; 118/724, 725
See application file for complete search history.

(56) References Cited

U.S. PATENT DOCUMENTS

| 4,518,244 | A | * | 5/1985 | Kageyama et al. | .............. 492/53 |
| 5,089,856 | A | * | 2/1992 | Landa et al. | ................... 399/308 |
| 6,094,334 | A | * | 7/2000 | Bedi et al. | ...................... 361/234 |
| 6,256,187 | B1 | * | 7/2001 | Matsunaga et al. | ........... 361/234 |
| 2010/0024941 | A1 | * | 2/2010 | Hara et al. | ..................... 152/510 |
| 2011/0092072 | A1 | * | 4/2011 | Singh et al. | ................... 438/710 |

FOREIGN PATENT DOCUMENTS

| JP | 2002324834 A | 8/2002 |
| JP | 2002324834 A | 11/2002 |
| JP | 2008277446 A | 11/2008 |
| JP | 2008300491 A | 12/2008 |
| JP | 2009054932 A | 3/2009 |
| JP | 2010040644 A | 2/2010 |
| JP | 2010045170 A | 2/2010 |
| JP | 2010153490 A | 7/2010 |

OTHER PUBLICATIONS

Japanese Patent Office, International Search Report issued in International Application No. PCT/JP2012/061402, mailed Jul. 31, 2012, 4 pp.

* cited by examiner

*Primary Examiner* — Sang Y Paik
(74) *Attorney, Agent, or Firm* — Wood, Herron & Evans, LLP

(57) ABSTRACT

An electrostatic chuck device includes an electrostatic chuck section (2), which has a principal surface that is a mounting surface on which a plate-like sample (W) is placed, and has an internal electrode for electrostatic adsorption (13) incorporated in the section, and a temperature adjustment base section (3) which adjusts the temperature of the electrostatic chuck section (2); wherein a part or all of a surface of the temperature adjustment base section (3) is covered by a sheet-like or film-like insulating material (4) wherein the surface faces the side where the electrostatic chuck section is located; a thin plate-like heater element (5) is bonded on the insulating material (4); and the electrostatic chuck section (2) and the temperature adjustment base section (3) are integrated with each other via an organic insulating adhesive layer (6) formed by curing a liquid adhesive.

16 Claims, 2 Drawing Sheets

ELECTROSTATIC CHUCK DEVICE

TECHNICAL FIELD

The present invention relates to an electrostatic chuck device.

Priority is claimed based on Japanese Patent Application No. 2011-099982 filed on Apr. 27, 2011, the contents of which are incorporated herein by reference.

BACKGROUND ART

In recent years, in a semiconductor manufacturing process, further improvement in fine processing technology has been required according to higher integration or higher performance of an element. In the semiconductor manufacturing process, etching technology is an important one among fine processing technologies. In recent years, among etching technologies, a plasma etching technology which can achieve high efficiency and enable fine processing of a large area has become mainstream.

The plasma etching technology is one of a dry etching technology. In the plasma etching technology, a mask pattern is formed by a resist on a solid material, that is an object to be processed, and in a state where the solid material is supported in a vacuum, a reactive gas is introduced into the vacuum. Then, a plasma state is made by collision between accelerated electrons and gas molecules due to a high-frequency electric field applied to the reactive gas. Radicals (free radicals) and ions, which are generated from the plasma, react with the solid material which is exposed from the mask pattern, and whereby the exposed solid material is removed as a reaction product. In this way, a fine pattern is formed in the solid material.

On the other hand, there is a plasma CVD method, as one of thin film growth technology in which source gases are combined by the action of plasma and the obtained compound is deposited on a substrate. This method is a film formation method in which plasma discharge is caused by applying a high-frequency electric field to gas which includes source molecules, then, the source molecules are decomposed by electrons accelerated by the plasma discharge, and the obtained compound is deposited. Even if it is reaction which does not occur by only thermal excitation at low temperature, since in plasma, gases in a system collide with each other and are activated, thereby being turned into radicals, reaction becomes possible.

In a semiconductor manufacturing apparatus using plasma, such as a plasma etching apparatus and a plasma CVD apparatus, in the past, an electrostatic chuck device has been used as a device to easily mount and/or fix a wafer onto a sample stage and also maintain the wafer at a desired temperature.

As such an electrostatic chuck device, for example, an electrostatic chuck is proposed which includes an electrostatic chuck section comprising an internal electrode for electrostatic adsorption, and a cooling base section which cools the electrostatic chuck section. A heater which is formed by a screen printing method and having a thickness of 0.5 mm or less is provided between the electrostatic chuck section and the cooling base section, and the heater is brought into direct contact with the electrostatic chuck section and also fixed to the cooling base section by an adhesive layer which has insulation properties and is formed of silicone resin (Patent document 1).

In addition, an electrostatic chuck device is also proposed which includes an electrostatic chuck section comprising an internal electrode for electrostatic adsorption, a temperature adjustment base section which adjusts the temperature of the electrostatic chuck section to a desired temperature, and an organic adhesive layer which integrates the electrostatic chuck section and the temperature adjustment base section by adhesion and includes a thin plate-like heater element made of nonmagnetic metal having a thickness of 200 μm or less (Patent document 2).

PRIOR ART DOCUMENTS

Patent Documents

Patent document 1: Japanese Unexamined Patent Application Publication No. 2008-300491
Patent document 2: Japanese Unexamined Patent Application Publication No. 2010-40644

DISCLOSURE OF INVENTION

Problem to be Solved by the Invention

In the electrostatic chuck device of Patent document 1 described above, the electrostatic chuck device has a structure in which the heater is directly screen-printed and baked on the rear surface of the electrostatic chuck section.

In the screen printing, adjustment of the thickness of the heater is difficult and in-plane variation in intrinsic resistivity of the printed heater itself easily occurs. Accordingly, variation of heat generated by the heater in a plane occurs, and as a result, there is a problem in that variation of temperature in a plane of a wafer and variation of temperature between the wafers occur.

Further, in the electrostatic chuck device of Patent document 2, in a case where undulation of the surface of the temperature adjustment base section is large, there is a problem in that variation also occurs in the thickness of the organic adhesive layer between the temperature adjustment base section and the heater element.

In this manner, in the electrostatic chuck devices of the related art, variation in the in-plane temperature distribution of the wafer which is placed on the electrostatic chuck section easily becomes large. Therefore, there is a problem in that it is not possible for a plate-like sample such as a wafer which is placed on the electrostatic chuck section to obtain sufficient uniformity of in-plane temperature.

The present invention has been made in view of the above-described circumstances and has an object to provide an electrostatic chuck device in which uniformity of the in-plane temperature of an adsorption surface of a plate-like sample is excellent.

Means for Solving the Problem

The inventors of the present invention have performed intensive studies in order to solve the above-described problems, and as a result, have found that when the following device is used, uniformity of the in-plane temperature of an adsorption surface of a plate-like sample which is placed on an electrostatic chuck section is improved, and the findings have led to the completion of the invention.

That is, a portion or the entirety of the surface which is located on the electrostatic chuck section side of a temperature adjustment base section, which adjusts the electrostatic chuck section to have a desired temperature, is covered by a sheet-like or film-like insulating material. Then, a thin plate-like heating member is bonded to the upper surface of the insulating material, that is, to the surface on the mounting surface side of the insulating material. In addition, the electrostatic chuck section and the temperature adjustment base section are bonded to and integrated with each other through an organic adhesive layer having insulation properties and formed by curing a liquid adhesive. In the invention, due to such a structure, it is possible to uniformize the distance between the heating member and the electrostatic chuck section and the distance between the heating member and the temperature adjustment base section. As a result, it is possible to improve uniformity of the in-plane temperature of the adsorption surface of the plate-like sample which is placed on the electrostatic chuck section.

That is, according to an aspect of the invention, there is provided an electrostatic chuck device including:

an electrostatic chuck section which has a principal surface that is amounting surface on which a plate-like sample is placed, wherein the electrostatic chuck section comprises an internal electrode for electrostatic adsorption which is incorporated in the section, and a temperature adjustment base section which adjusts the temperature of the electrostatic chuck section; wherein a part or all of a surface of the temperature adjustment base section is covered by a sheet-like or film-like insulating material, wherein the surface faces to the side where the electrostatic chuck section is located;

a thin plate-like heating member is bonded to a surface of the insulating material, wherein the surface faces to the side where the mounting surface exists; and the electrostatic chuck section and the temperature adjustment base section are integrated with each other via an organic insulating adhesive layer formed by curing a liquid adhesive.

In the electrostatic chuck device, a portion or the entirety of the surface on the electrostatic chuck section side of the temperature adjustment base section is covered by the sheet-like or film-like insulating material, the thin plate-like heating member is bonded to the surface on the mounting surface side of the insulating material, and the electrostatic chuck section and the temperature adjustment base section are bonded to and integrated with each other through the organic adhesive layer having insulation properties and formed by curing a liquid adhesive. Due to this structure, the distance between the heating member and the mounting surface of the electrostatic chuck section and the distance between the heating member and the temperature adjustment base section can be accurately maintained by the insulating material, the heating member, and the organic adhesive layer. Due to this structure, a concern that uniformity of the in-plane temperature of the plate-like sample may decrease due to variation in the thickness of an adhesive layer is eliminated. Accordingly, uniformity of the in-plane temperature of the adsorption surface of the plate-like sample which is placed on the electrostatic chuck section is improved and uniformity of temperature between the plate-like samples is also improved.

In the electrostatic chuck device according to the above aspect of the invention, it is preferable that the heating member be a thin plate-like heater element made of nonmagnetic metal and having a thickness of 0.2 mm or less.

In the electrostatic chuck device according to the above aspect of the invention, it is preferable that variation in the thickness of the insulating material be 10 μm or less.

In the electrostatic chuck device according to the above aspect of the invention, it is preferable that the Shore hardness of the organic adhesive layer be A90 or less and the thermal conductivity of the organic adhesive layer be 0.15 W/mk or more.

In the electrostatic chuck device according to the above aspect of the invention, it is preferable that the thickness of the organic adhesive layer be 50 μm or more and the Young's modulus of a spacer which is disposed between the electrostatic chuck section and the heating member be 10 GPa or less.

In the electrostatic chuck device according to the above aspect of the invention, it is preferable that the heat transfer coefficient between the heating member and the temperature adjustment base section be smaller than the heat transfer coefficient between the heating member and the electrostatic chuck section.

Effects of Invention

In the electrostatic chuck device according to the above aspect of the invention, a portion or the entirety of the surface on the electrostatic chuck section side of the temperature adjustment base section is covered by the sheet-like or film-like insulating material, the thin plate-like heating member is bonded to the surface on the mounting surface side of the insulating material, and the electrostatic chuck section and the temperature adjustment base section are bonded to and integrated with each other through the organic adhesive layer having insulation properties and formed by curing a liquid adhesive. Due to this structure, it is possible to accurately maintain the distance between the heating member and the mounting surface of the electrostatic chuck section and the distance between the heating member and the temperature adjustment base section. Therefore, a decrease in uniformity of the in-plane temperature of the plate-like sample due to variation in the thickness of an adhesive layer is eliminated, and thus it is possible to improve uniformity of the in-plane temperature of the adsorption surface of the plate-like sample which is placed on the electrostatic chuck section.

Further, even in a case where a plurality of plate-like samples is sequentially placed on the mounting surface and various treatments are sequentially performed on the plate-like samples, it is possible to improve uniformity of temperature between the plate-like samples and it is possible to reduce product variation between the plate-like samples.

In the invention, it is preferable to make the heating member be a thin plate-like heater element made of nonmagnetic metal and having a thickness of 0.2 mm or less, and when such a structure is adopted, even in a case where the electrostatic chuck device according to the invention is used in a high-frequency atmosphere, there is no concern that the heater element may perform self-heating by a high frequency. Therefore, it is possible to make it difficult for the pattern of the heater element to be reflected in the plate-like sample, and it is possible to maintain the in-plane temperature of the plate-like sample in a desired temperature pattern.

In the invention, it is preferable to make variation in the thickness of the insulating material be 10 μM or less, and when such a structure is adopted, it is possible to suppress variation in distance between the heating member and the temperature adjustment base section to 10 μM or less, and it is possible to accurately maintain the distance between the heating member and the temperature adjustment base section.

In the invention, it is preferable to make the Shore hardness of the organic adhesive layer be A90 or less and make the thermal conductivity of the organic adhesive layer be 0.15 W/mk or more, and when such a structure is adopted, it is possible to suppress deformation due to a difference in thermal expansion between the electrostatic chuck section and the temperature adjustment base section by the organic adhesive layer, and it is possible to accurately maintain the distance, and as a result, it is possible to improve heat conduction between the heating member and the mounting surface that is one principal surface (a principal surface on one side of two principal surfaces) of the electrostatic chuck section.

In the invention, it is preferable to make the thickness of the organic adhesive layer be 50 μm or more and make the Young's modulus of the spacer which is disposed between the electrostatic chuck section and the heating member be 10 GPa or less. In addition, it is preferable that the coefficient of thermal expansion of the spacer be in a range of 50% to 200% of the coefficient of thermal expansion of an organic adhesive.

When such a structure is adopted, it is possible to uniformize in-plane temperature distribution by a rise in temperature at the time of various treatments of the plate-like sample which is placed on the mounting surface of the electrostatic chuck section.

In the invention, it is preferable to make the heat transfer coefficient between the heating member and the temperature adjustment base section smaller than the heat transfer coefficient between the heating member and the electrostatic chuck section, and when such a structure is adopted, it is possible to make it easy for heat generated from the heating member to flow to the electrostatic chuck section and also make it difficult for heat generated from the heating member to flow to the temperature adjustment base section. Therefore, it is possible to efficiently transfer heat generated from the heating member to the plate-like sample through the electrostatic chuck section.

BEST MODE FOR CARRYING OUT THE INVENTION

Figure 1:
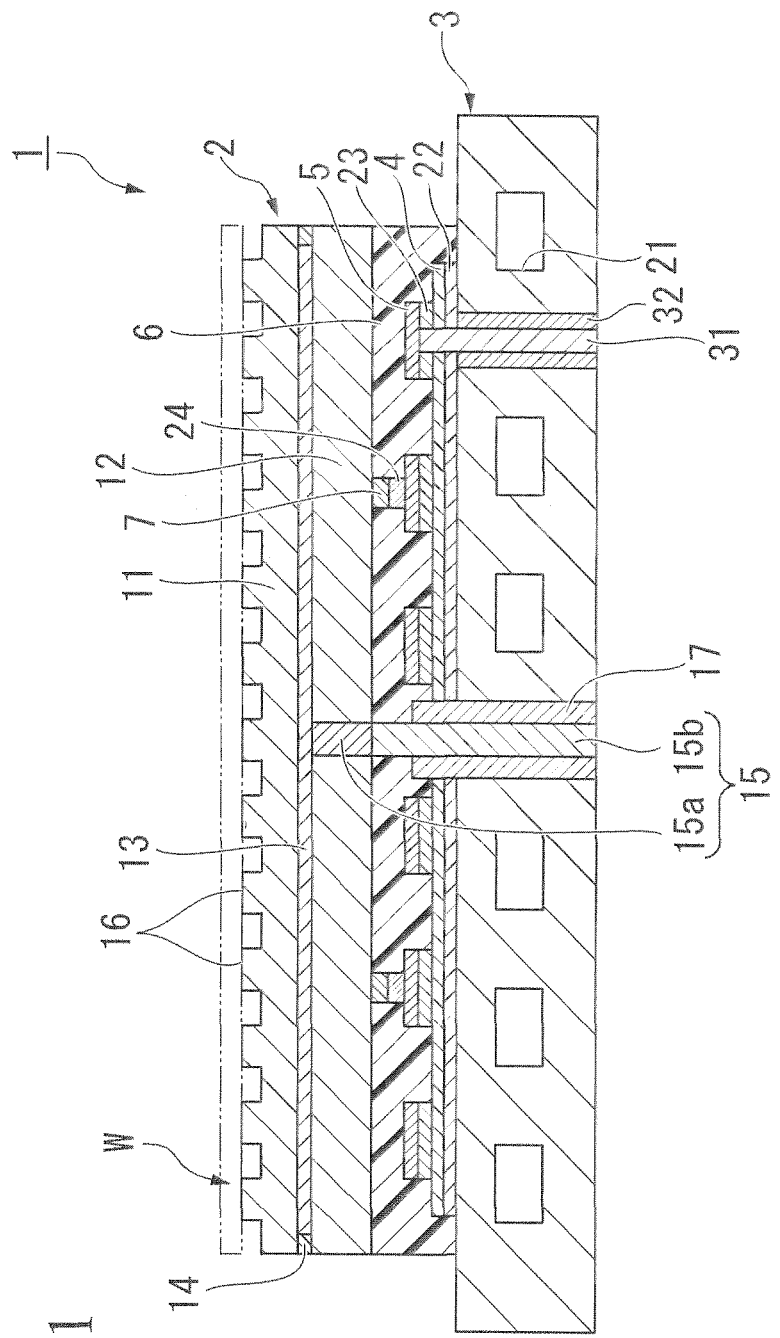
FIG. 1 is a cross-sectional view showing an electrostatic chuck device according to an embodiment of the invention.

The invention relates to an electrostatic chuck device which is suitably used when adsorbing and fixing a plate-like sample such as a semiconductor wafer in a semiconductor manufacturing process by an electrostatic force and in which uniformity of the in-plane temperature of an adsorption surface of the plate-like sample is excellent.

Hereinafter, a mode for carrying out an electrostatic chuck device according to the invention will be described based on the drawings.

In addition, this mode is intended to be specifically described for better understanding of the gist of the invention and is not intended to limit the invention unless otherwise specified. A change, omission, or addition of the number, a position, a size, a numerical value, or the like can be made within a scope which does not depart from the invention. Further, in order to facilitate explanation, a dimension or a ratio used in the drawings is sometimes different from an actual dimension or ratio.

FIG. 1 is a cross-sectional view showing an electrostatic chuck device according to an embodiment of the invention. An electrostatic chuck device 1 is configured to include a disk-like electrostatic chuck section 2, a disk-like temperature adjustment base section 3 with a thickness to some extent, which adjusts the electrostatic chuck section 2 to have a desired temperature, a sheet-like or film-like insulating material 4 which covers a portion of the surface on the electrostatic chuck section 2 side of the temperature adjustment base section 3, a thin plate-like heater element 5 bonded to the surface on the electrostatic chuck section 2 side of the insulating material 4, an organic adhesive layer 6 having insulation properties and formed by curing a liquid adhesive, which bonds and integrates the electrostatic chuck section 2 and the temperature adjustment base section 3, and a spacer 7 which maintains the distance between the electrostatic chuck section 2 and the heater element 5 at a constant distance.

The electrostatic chuck section 2 is configured to include a mounting plate 11, the upper surface of which is a mounting surface on which a plate-like sample W such as a semiconductor wafer is placed; a support plate 12 which is located on the lower surface of the mounting plate 11 and integrated with the mounting plate 11, thereby supporting the mounting plate 11; an internal electrode for electrostatic adsorption 13 provided between the mounting plate 11 and the support plate 12; an insulating material layer 14 which is provided around the internal electrode for electrostatic adsorption 13 and isolates the internal electrode for electrostatic adsorption 13; and a power feeding terminal 15 which is provided so as to pass through the support plate 12 and applies direct-current voltage to the internal electrode for electrostatic adsorption 13.

A projection portion 16 which has a columnar shape, in which the upper surface thereof is R-processed, that is, an end portion of the upper surface is chamfered roundly, and which has a diameter smaller than the thickness of the plate-like sample is formed in plural pieces on the mounting surface of the mounting plate 11. A configuration is made in which the plate-like sample W which is placed on the mounting plate 11 is supported by the projection portions 16. As for the shape of the projection portion, it is acceptable if it is possible to support the plate-like sample W, and it can be optionally selected. For example, it may be a circular cylinder, may also be a square pillar or other columnar shapes, and may also be any other shape.

Materials or the shapes of the mounting plate 11 and the support plate 12 can be optionally selected. It is preferable that the mounting plate 11 and the support plate 12 be disk-like plates or other similar shapes in which the shapes of two surfaces which face each other when being superimposed on one another are the same shape. The sizes of the two surfaces which face each other may be the same or may also be different from each other. Specific examples of each of the mounting plate 11 and the support plate 12 includes a plate made of a ceramic sintered body having mechanical strength and also having resistance to a corrosive gas and plasma thereof, and insulation properties, such as an aluminum oxide-silicon carbide ($Al_2O_3$—SiC) composite sintered body, an aluminum oxide ($Al_2O_3$) sintered body, and an aluminum nitride (AlN) sintered body. The thicknesses of the mounting plate 11 and the support plate 12 can be optionally selected. However, it is preferable that the thickness of the mounting plate 11 be in a range of 0.3 mm to 2 mm, and it is more preferable that the thickness be in a range of 0.5 mm to 0.7 mm. It is preferable that the thickness of the support plate 12 be in a range of 1 mm to 6 mm, and it is more preferable that the thickness be in a range of 2 mm to 4 mm.

The internal electrode for electrostatic adsorption 13 is used as an electrode for an electrostatic chuck for generating electric charges, thereby fixing the plate-like sample W which is placed, to the mounting surface of the mounting plate 11 by an electrostatic adsorption force. The shape or the size of the internal electrode for electrostatic adsorption 13 is appropriately adjusted and used according to the use thereof.

The internal electrode for electrostatic adsorption 13 may be formed of any material. However, it is preferable that the internal electrode for electrostatic adsorption 13 be formed of conductive ceramics such as an aluminum oxide-tantalum carbide ($Al_2O_3$—TaC) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN—W) conductive composite sintered body, or an aluminum nitride-tantalum (AlN—Ta) conductive composite sintered body, or high melting point metal such as tungsten (W), tantalum (Ta), molybdenum (Mo), or titanium (Ti).

The thickness of the internal electrode for electrostatic adsorption 13 is not particularly limited. However, it is preferable that the thickness be in a range of 1 μm or more and 50 μm or less, more preferably, a range of 3 μm or more and 35 μm or less, and particularly preferably, a range of 5 μm or more and 20 μm or less. The reason is because, if the thickness is less than 1 μm, area resistance becomes too large, and thus there is a case where it is not possible to secure sufficient electric conductivity, and on the other hand, if the thickness exceeds 50 μm, there is a possibility that cracks may occur in joint interfaces between the internal electrode for electrostatic adsorption 13, and the mounting plate 11 and the support plate 12 due to a difference in coefficient of thermal expansion between the internal electrode for electrostatic adsorption 13, and the mounting plate 11 and the support plate 12.

The internal electrode for electrostatic adsorption 13 having such a preferable thickness can be easily formed by a film formation method such as a sputtering method or a vapor deposition method, or a coating method such as a screen printing method. The shape thereof can also be optionally selected. However, screen printing is more preferable in terms of cost and productivity. The outer diameter of the internal electrode for electrostatic adsorption is 1 mm or more smaller than the outer diameter of the mounting surface 2, and in order to produce an electrostatic adsorption force which makes the plate-like sample W be uniformly adsorbed onto the mounting plate 11, a shape equivalent, as close as possible, to the plate-like sample W is preferable.

The insulating material layer 14 surrounds and confines the internal electrode for electrostatic adsorption 13, thereby protecting the internal electrode for electrostatic adsorption 13 from a corrosive gas and plasma thereof, and also integrates a boundary portion between the mounting plate 11 and the support plate 12, that is, an outer peripheral portion area outside the internal electrode for electrostatic adsorption 13 by joining. It is preferable that the insulating material layer 14 be configured by an insulating material having the same composition or the same main component as a material that configures the mounting plate 11 and the support plate 12.

The power feeding terminal 15 is a rod-shaped body provided in order to apply direct-current voltage to the internal electrode for electrostatic adsorption 13. The power feeding terminal 15 may be, for example, a circular cylinder or a square pole. The power feeding terminal 15 is configured to include a power feeding terminal 15a, which is fixed to the electrostatic chuck section 2, and a power feeding terminal 15b, which is integrated with the power feeding terminal 15a by joining to be electrically connected to the power feeding terminal 15a, and is fixed by the temperature adjustment base section 3, an insulator 17 and the organic adhesive layer 6. The size of the power feeding terminal 15 can be optionally selected. However, for example, when the power feeding terminal 15 is a circular cylinder, it is preferable that the diameter of a cross section thereof be in a range of 1 mm to 5 mm. If the diameter is smaller than 1 mm, there is a case where alignment of the power feeding terminal 15a and the power feeding terminal 15b becomes difficult and conduction between them is not possible. Further, if the diameter thereof is larger than 5 mm, a penetration portion of the heater element 5 becomes large, an area having no heating element increases, and therefore there is a case where soaking characteristics deteriorate. The position of the power feeding terminal 15 can be optionally selected. However, it is preferable that at least one power feeding terminal 15 be disposed in the area of the internal electrode for electrostatic adsorption 13.

As a material of the power feeding terminal 15, it is favorable if the material is an electrically-conductive material having excellent heat resistance, and there is no particular limitation.

For example, it is preferable that the power feeding terminal 15a have a coefficient of thermal expansion which is close to the coefficients of thermal expansion of the internal electrode for electrostatic adsorption 13 and the support plate 12. For example, metal materials such as tungsten (W), tantalum (Ta), molybdenum (Mo), niobium (Nb), and a Kovar alloy, or conductive ceramics, which have the same or similar composition to the internal electrode for electrostatic adsorption 13 are suitably used.

On the other hand, it is preferable that the power feeding terminal 15b has a coefficient of thermal expansion which is close to the coefficients of thermal expansion of the temperature adjustment base section 3 and the organic adhesive layer 6 described later. For example, it is preferable that the power feeding terminal 15b has the same composition as the temperature adjustment base section 3, or a similar composition of the section. For example, a metal material such as aluminum (Al) an aluminum alloy, copper (Cu), a copper alloy, stainless steel (SUS), titanium (Ti), or the like is suitably used for the power feeding terminal 15b.

The power feeding terminal 15 is insulated from the temperature adjustment base section 3 by the insulator 17 which partially surrounds the power feeding terminal 15.

Then, the power feeding terminal 15 is integrated with the support plate 12 by joining. In addition, the mounting plate 11 and the support plate 12 are joined and integrated with each other by the internal electrode for electrostatic adsorption 13 and the insulating material layer 14. In this way, the electrostatic chuck section 2 is configured.

The thickness of the electrostatic chuck section 2, that is, the total thickness of the mounting plate 11, the support plate 12, the internal electrode for electrostatic adsorption 13, and the insulating material layer 14 can be optionally selected. However, it is preferable that the thickness be in a range of 1 mm or more and 6 mm or less. The reason is that if the thickness of the electrostatic chuck section 2 is less than 1 mm, there is a case where the mechanical strength of the electrostatic chuck section 2 cannot be secured, and the shape of the heater element is reflected in temperature distribution of the plate-like sample W and uniformity of the in-plane temperature of the plate-like sample W decreases, and therefore it is not preferable.

On the other hand, if the thickness of the electrostatic chuck section 2 exceeds 6 mm, the heat capacity of the electrostatic chuck section 2 which has the mounting plate 11 and the support plate 12 becomes too large, and as a result, the thermal responsiveness of the plate-like sample W which is mounted thereon is degraded. Therefore, when the temperature of the plate-like sample W is adjusted for each zone in a plane by a plurality of heater elements, there is a case where a range of the controlled temperature between the zones is reduced, and thus it is not preferable.

The temperature adjustment base section 3 is provided on the lower side of the electrostatic chuck section 2. The temperature adjustment base section 3 adjusts the temperature of the electrostatic chuck section 2, thereby controlling the mounting surface of the mounting plate 11 to have a desired temperature, and may be used as an electrode for high frequency generation.

A flow path 21 which circulates a cooling medium such as water or an organic solvent can be formed in the temperature adjustment base section 3. The temperature of the plate-like sample W which is placed on the mounting plate 11 can be maintained at a desired temperature due to the flow path. The shape of the flow path may be optionally selected.

A material which configures the temperature adjustment base section 3 can be optionally selected. In so far as the material is metal having excellent thermal conductivity, electric conductivity, and workability, or is a composite material which includes the metal, any material can be used without limitation. For example, aluminum (Al), an aluminum alloy, copper (Cu), a copper alloy, stainless steel (SUS), or the like is suitably used. The thickness of the section can be optionally selected. However, it is preferable that the thickness be in a range of 20 mm to 60 mm. In a case where the thickness is 20 mm or less, there is a case where construction of the flow path 22 becomes difficult. In a case where the thickness is 60 mm or more, the weight of the section becomes heavy, and workability of mounting on a semiconductor manufacturing apparatus may be poor.

It is preferable that at least the surface of the temperature adjustment base section 3, wherein the surface is exposed to plasma, is subjected to alumite treatment, or an insulating film such as alumina is formed on the surface.

The insulating material 4 is a sheet-like or film-like resin having heat resistance and insulation properties. The insulating resin can be optionally selected, and for example, polyimide resin, silicone resin, epoxy resin, acrylic resin, and the like can be given.

The thickness of the insulating material 4 can be optionally selected. However, it is preferable that the thickness be in a range of 5 μm to 100 μm. The shape of the material can also be optionally selected. It is preferable that a shape wherein electrical insulation between the base section 3 and the heater element 5 is achieved is used. Further, it is preferable that in-plane variation of thickness thereof is within 10 μm.

If variation in the in-plane thickness of the insulating material 4 exceeds 10 μm, a difference occurs in temperature distribution according to the difference of the thickness. As a result, temperature control which is performed by thickness adjustment of the insulating material 4 is adversely affected by the variation, and therefore, such variation is not preferable.

The insulating material 4 is bonded and fixed to the surface of the temperature adjustment base section 3, wherein the surface is located on the electrostatic chuck section 2 side, by a sheet-like or film-like adhesive layer 22 (a first adhesive layer) which has a uniform thickness and also has heat resistance and insulation properties.

The thickness of the adhesive layer 22 can be optionally selected. However, it is preferable that the thickness be in a range of 10 μm to 100 μm. Further, it is preferable that in-plane variation of thickness thereof be within 10 μm.

Here, if in-plane variation of the thickness of the adhesive layer 22 exceeds 10 μm, variation exceeding 10 μm occurs in the in-plane area existing between the insulating material 4 and the temperature adjustment base section 3. As a result, there is a possibility that temperature control which is performed by thickness adjustment of the insulating material 4 may be adversely affected, and therefore, such a variation is not preferable.

The type of the adhesive layer 22 can be optionally selected. However, it is preferable that the adhesive layer 22 be an acrylic adhesive, an epoxy adhesive, a silicone adhesive, or the like.

The heater element 5 can be optionally selected. Preferably, the heater element 5 has at least one continuous pattern which has two end portions and a shape in which a strip-like metal material having a narrow width is meandered. The number of continuous patterns that are provided may be one, or may be two, three, or four. Power feeding terminals 31 are connected to both end portions of the heater element 5. The power feeding terminal 31 is insulated from the temperature adjustment base section 3 due to an insulator 32.

The heater element 5 accurately controls in-plane temperature distribution of the plate-like sample W, which is fixed to the projection portions 16 of the mounting plate 11 by electrostatic adsorption, due to control of applied voltage.

A material or conditions of the heater element 5 can be optionally selected. It is preferable that the heater element be a nonmagnetic metal thin plate having a constant thickness of preferably 0.01 mm or more and 0.2 mm or less. For example, the heater element 5 can be formed by etching a titanium (Ti) thin plate, a tungsten (W) thin plate, a molybdenum (Mo) thin plate, or the like to a desired heater pattern by a photolithographic method.

Here, the reason that the thickness of the heater element 5 is set to be 0.2 mm or less is described below. If the thickness exceeds 0.2 mm, the pattern shape of the heater element 5 is reflected to the temperature distribution of the plate-like sample W. Such reflection becomes a factor of temperature variation of the plate-like sample W, wherein the variation is originated from a difference in thermal conductivity between the heater element section and the adhesive layer. Furthermore, variation of heater width in a thickness direction occurs due to an increase in etching thickness. For example, a cross section of a heater formed by etching becomes a trapezoidal shape, and a difference in dimension between the base and the upper side of a trapezoid increases, as the thickness of the heater element increases. Therefore, such variation is not preferable.

Further, when the heater element 5 is formed of a nonmagnetic metal thin plate having a constant thickness of 0.2 mm or less, self-heating of the heater element 5 is not caused by a high frequency even in a case where the electrostatic chuck device 1 is used in a high-frequency atmosphere. Therefore, it becomes easy to maintain the in-plane temperature of the plate-like sample W at a desired constant temperature or in a desired constant temperature pattern.

Further, when the heater element 5 is formed by using a nonmagnetic metal thin plate having a constant thickness, the thickness of the heater element 5 becomes constant on the entire heating surface and a calorific value also becomes constant on the entire heating surface. Therefore, it is possible to uniformize the temperature distribution in the mounting surface of the electrostatic chuck section 2.

The heater element 5 is bonded and fixed to the surface of the insulating material 4, wherein the surface is located on the electrostatic chuck section 2 side, by a sheet-like or film-like adhesive layer 23 (a second adhesive layer) which has a uniform thickness and has heat resistance and insulation properties, similar to the insulating material 4.

The in-plane thickness of the adhesive layer 23 can be optionally selected. However, it is preferable that the thickness be in a range of 10 μm to 100 μm. The shape thereof can also be optionally selected. However, it is preferable that the shape thereof be a shape which is equivalent to that of the heater element 5 or a shape which is equivalent to that of the insulating material 4. It is preferable that variation in thickness be within 10 μm.

If variation in the in-plane thickness of the adhesive layer 23 exceeds 10 μm, variation exceeding 10 μm occurs in the in-plane distance between the heater element 5 and the insulating material 4. As a result, temperature control by thickness adjustment of the insulating material 4 is adversely affected, and therefore, such variation is not preferable.

The type of the adhesive layer 23 can be optionally selected. However, it is preferable that the adhesive layer 23 be an acrylic adhesive, an epoxy adhesive, a silicone adhesive, or the like.

The organic adhesive layer 6 (a third adhesive layer) is an organic adhesive layer having insulation properties and formed by curing a liquid organic adhesive. The organic adhesive layer 6 is an organic adhesive layer having insulation properties, which integrates the electrostatic chuck section 2 and the combination of the temperature adjustment base section 3, the insulating material 4, and the heater element 5 by adhesion so that the section faces to the combination.

It is preferable that the thickness of the organic adhesive layer 6 be 200 μm or less, and it is more preferable that the thickness be 100 μm or less. The lower limit of the thickness of the organic adhesive layer 6 can be optionally selected. However, in general, the lower limit is 20 μm or more.

Here, the reason that the thickness of the organic adhesive layer 6 is set to be 200 μM or less is that if the thickness exceeds 200 μm, a change in thickness due to curing shrinkage of a liquid organic adhesive becomes too large. Therefore, voids are generated in the obtained organic adhesive layer 6 due to curing shrinkage, and therefore, adhesive strength is reduced, and the heat transfer coefficient of the adhesive layer is reduced. Furthermore, as a result, the temperature rising performance and the cooling performance of the electrostatic chuck section deteriorate.

It is preferable that the Shore hardness of the organic adhesive layer 6 be A90 or less, and more preferably, the Shore hardness is A70 or less. The lower limit can be optionally selected. However, in general, the lower limit is A20 or more.

The reason that the Shore hardness of the organic adhesive layer 6 is set to be A90 or less is that if the Shore hardness exceeds A90, the organic adhesive layer 6 becomes too hard and thus it becomes difficult to relax stress between the electrostatic chuck section 2 and the temperature adjustment base section 3.

The organic adhesive having insulation properties, which forms the organic adhesive layer 6, may be optionally selected. For example, an acrylic adhesive is preferably used. As an example of the acrylic adhesive, acrylic acid and an ester thereof, methacrylic acid and an ester thereof, acrylamide, acrylonitrile, and polymers or copolymers thereof can be given.

Among them, in particular, a polyacrylic acid ester such as polymethyl acrylate, a polymethacrylic acid ester such as polymethyl methacrylate, or the like is suitably used.

It is preferable that the acrylic adhesive contains vinyl acetate or vinyl butyrate in an amount of 1% by volume or more and 50% by volume or less, more preferably 10% by volume or more and 40% by volume or less, and still more preferably 20% by volume or more and 30% by volume or less.

When the acrylic adhesive contains vinyl acetate or vinyl butyrate in an amount of 1% by volume or more and 50% by volume or less, flexibility of the acrylic adhesive is improved, and as a result, stress between the electrostatic chuck section 2 and the temperature adjustment base section 3, the insulating material 4, and the heater element 5 is further alleviated.

It is preferable that the thermal conductivity of the organic adhesive layer 6 be 0.15 W/mk or more, more preferably 0.2 W/mk or more, and further preferably 0.25 W/mk or more. The upper limit thereof can be optionally selected. However, in general, the upper limit is 5 W/mk or less.

Here, if the thermal conductivity is less than 0.15 W/mk, heat transfer from the heater element 5 to the electrostatic chuck section 2 becomes difficult. As a result, uniformity of the in-plane temperature of the adsorption surface of the plate-like sample W which is placed on the electrostatic chuck section 2 deteriorates, and temperature uniformity between the plate-like samples W also deteriorates, and therefore, such value is not preferable. Further, temperature rising rate and cooling rate of the plate-like sample W decrease, and therefore, such value is not preferable.

The spacer 7 is provided between the heater element 5 and the electrostatic chuck section 2, thereby maintaining the distance between the heater element 5 and the electrostatic chuck section 2 at a predetermined distance. Due to the spacer 7, it is possible to maintain the distance between the heater element 5 and the electrostatic chuck section 2, that is, the distance between the electrostatic chuck section 2 and the temperature adjustment base section 3 at a predetermined distance.

Adhesion of the spacer 7 is performed by an adhesive layer, similar to the heater element 5 and the insulating material 4. Specifically, the spacer 7 is bonded and fixed to the surface of the heater element 5, wherein the surface is located on the electrostatic chuck section 2 side, by a sheet-like or film-like adhesive layer 24 (a fourth adhesive layer) which has a uniform thickness and also has heat resistance and insulation properties.

The thickness of the adhesive layer 24 can be optionally selected. However, it is preferable that the thickness be in a range of 10 to 100 μm. The shape of the layer can also be optionally selected. However, it is preferable that the shape be a circle or a square. The type of the adhesive layer 24 can be optionally selected. However, it is preferable that the adhesive layer 24 is formed by an adhesive such as an acrylic adhesive, an epoxy adhesive and a silicone adhesive.

It is preferable that the Young's modulus of the spacer 7 be 10 GPa or less, and more preferably 1 MPa or more and 10 GPa or less.

Here, the reason that the Young's modulus of the spacer 7 is set to be 10 GPa or less is described below. If the Young's modulus of the spacer 7 exceeds 10 GPa, stress at the time of curing shrinkage is concentrated on the spacer 7, when the organic adhesive layer 6 is formed and the curing shrinkage of a liquid organic adhesive is caused. As a result, generation of voids and peeling-off of the adhesive layer occur, and therefore, such value is not preferable.

In the electrostatic chuck device 1, the heat transfer coefficient between the heater element 5 and the temperature adjustment base section 3 is smaller than the heat transfer coefficient between the heater element 5 and the electrostatic chuck section 2.

In the electrostatic chuck device 1, since the heat transfer coefficient between the heater element 5 and the temperature adjustment base section 3 is smaller than the heat transfer coefficient between the heater element 5 and the electrostatic chuck section 2, heat generated from the heater element 5 is transmitted to the electrostatic chuck section 2. Due to this feature, it becomes difficult for heat generated from the heater element 5 to be transmitted to the temperature adjustment base section 3. Accordingly, it becomes possible to efficiently transfer heat generated from the heater element 5 to the plate-like sample W through the electrostatic chuck section 2.

Next, an example of a method of manufacturing the electrostatic chuck device 1 will be described.

(Formation of Electrostatic Chuck Section)

First, the plate-like mounting plate 1 and the plate-like support plate 12 are manufactured as an aluminum oxide-silicon carbide ($Al_2O_3$—SiC) composite sintered body. In this case, each of the mounting plate 11 and the support plate 12 can be obtained by; molding a mixed powder which includes silicon carbide powder and aluminum oxide powder into a desired shape, and then performing firing of the powder for a predetermined time at a temperature, for example, in a range of 1600° C. to 2000° C., in a non-oxidizing atmosphere, preferably, an inert atmosphere.

Subsequently, a fixing hole for fitting and holding the power feeding terminal 15a is formed in at least one place in the support plate 12.

Subsequently, the power feeding terminal 15a is formed so as to have a size and a shape which can be closely fixed to the fixing hole of the support plate 12. A method of fabricating the power feeding terminal 15a can be optionally selected. For example, in a case where the power feeding terminal 15a is a conductive composite sintered body, a method wherein conductive ceramic powder is molded into a desired shape, and then firing of the powder is performed under reduce pressure, or the like can be given.

As the conductive ceramic powder, any material can be selected. Conductive ceramic powder which is made of a material similar to that of the internal electrode for electrostatic adsorption 13 is preferably used.

Further, in a case where the power feeding terminal 15a is made of metal, the following method or the like can be used wherein high melting point metal is used, and a desired shape is formed from the metal by a metal processing method such as powder metallurgy, a grinding method or the like. Then, the power feeding terminal 15a is fitted into the fixing hole of the support plate 12.

Subsequently, a coating liquid used for forming an internal electrode for electrostatic adsorption, wherein the liquid includes a conducting material such as the above-described conductive ceramic powder dispersed in an organic solvent, is applied onto a predetermined area of the surface of the support plate 12 to which the power feeding terminal 15a is fitted therein, so that the liquid contacts with the power feeding terminal 15a. Then, the coating film is dried, thereby forming a layer which is used to form an internal electrode for electrostatic adsorption.

As a coating method which is used for the above liquid, a screen printing method is preferably used, since a coating liquid can be coated while a uniform thickness thereof is maintained. Further, as another method, there is a method wherein a thin film made of the above-described high melting point metal is formed by a vapor deposition method or a sputtering method, a method wherein a thin plate made of the above-described conductive ceramics or high melting point metal is disposed to form the layer which is used to form an internal electrode for electrostatic adsorption, or the like.

Further, in order to improve insulation properties, corrosion resistance and a plasma resistance property, the insulating material layer 14 is formed on the support plate 12 so that the layer is formed at an area other than the area where the layer, which is used to form an internal electrode for electrostatic adsorption, is formed. The layer 14 includes a powder material which has the same composition or includes the same main component as the mounting plate 11 and the support plate 12. The insulating material layer 14 can be formed by optionally selected method. For example, it is possible to form the insulating material layer 14 by applying a coating liquid on the above-described predetermined area by screen printing or the like and then performing drying, wherein the coating liquid includes insulating material powder which has the same composition or includes the same main component as the mounting plate 11 and the support plate 12 and is dispersed in an organic solvent.

Subsequently, the mounting plate 11 is superimposed on the layer which is used to form an internal electrode for electrostatic adsorption and the insulating material layer on the support plate 12. Subsequently, the mounting plate 11 is integrated with the layers by hot pressing at a high temperature and high pressure. An atmosphere used in the hot pressing can be optionally selected. However, a vacuum or an inert atmosphere such as Ar, He, or $N_2$ is preferably used. Further, pressure or temperature used for the hot pressing can be optionally selected. However, it is preferable that the pressure be in a range of 5 MPa to 10 MPa and the temperature be in a range of 1600° C. to 1850° C.

Due to the hot pressing, the layer which is used to form an internal electrode for electrostatic adsorption is fired, thereby the internal electrode for electrostatic adsorption 13 made of a conductive composite sintered body is formed. At the same time, the support plate 12 and the mounting plate 11 are joined to and integrated with each other via the insulating material layer 14 interposed therebetween.

Further, the power feeding terminal 15a is re-fired by hot pressing at a high temperature and high pressure, thereby being closely fixed to the fixing hole of the support plate 12.

Then, the upper and lower surfaces and the outer periphery of the joined body are machined by optionally selected method, and a gas hole or the like is formed by machining, as necessary, whereby the electrostatic chuck section 2 is formed.

(Formation of Base Section)

On the other hand, by performing machining on a metal material made of aluminum (Al), an aluminum alloy, copper (Cu), a copper alloy, stainless steel (SUS), or the like, a flow path or the like in which water is circulated is formed in the inside of the metal material. In addition, a fixing hole for fitting and holding the power feeding terminal 15b and the insulator 17 and a fixing hole for fitting and holding the power feeding terminal 31 and the insulator 32 are formed, whereby the temperature adjustment base section 3 is obtained.

It is preferable that alumite treatment is performed on at least a surface of the temperature adjustment base section 3, wherein the surface is exposed to plasma, or an insulating film such as alumina is formed on the surface of the section.

(Formation of Heater Element)

A nonmagnetic metal thin plate having a constant thickness of 0.2 mm or less, such as a titanium (Ti) thin plate, a tungsten (W) thin plate, or a molybdenum (Mo) thin plate, is prepared. The thin plate is brought into close contact with a material which is used as the insulating material 4, by using a sheet-like or film-like adhesive (the adhesive 23), which has a predetermined shape pattern, a uniform thickness, and heat resistance and insulation properties. Then, the nonmagnetic metal thin plate is etched into a desired heater pattern by a photolithographic method, thereby forming the heater element 5. At this time, the adhesive layer 23 and the insulating material 4 are not etched.

Subsequently, the surface of the temperature adjustment base section 3, wherein the surface is located on the electrostatic chuck section 2 side, is degreased and cleaned by using, for example, acetone or the like. The sheet-like or film-like adhesive layer 22 having heat resistance and insulation properties is stuck to a predetermined position of the surface.

Subsequently, the insulating material 4 to which the heater element 5 is bonded is provided on the adhesive layer 22 so that the insulating material 4 and the adhesive layer 22 are bonded to each other. The insulating material 4 is a sheet-like or film-like resin having heat resistance and insulation properties, which has the same shape as that of the adhesive layer 22 and planar shape, and is formed of polyimide resin, silicone resin, epoxy resin, acrylic resin, or the like.

(Disposition of Spacer)

A spacer in which a sheet-like spacer material 7 and the sheet-like adhesive 24 are stuck to each other and shaped into a predetermined shape, as necessary, is bonded and fixed to an arbitrary selected position on the element 5. Here, the spacer material of the spacer and the adhesive 24 have the same shape.

(Bonding of Electrostatic Chuck Section and Base Section)

Subsequently, an organic adhesive having insulation properties is applied onto the temperature adjustment base section 3 which has the insulating material 4, the heater element 5, the spacer 7, and the adhesive layer. The adhesive can be optionally selected, and for example, an acrylic adhesive such as acrylic acid and an ester thereof, methacrylic acid and an ester thereof, acrylamide, acrylonitrile, and polymers or copolymers thereof can be given. The application amount of the organic adhesive having insulation properties is set to be in a range of the predetermined amount such that the electrostatic chuck section 2 and the temperature adjustment base section 3 can be joined to and integrated with each other in a state where a constant distance is maintained by the spacer 7 and the like. The predetermined amount described above refers to the amount of adhesive which is greater than or equal to a spatial volume provided as an adhesive portion which is produced by the spacer 7. A method of applying the adhesive can be optionally selected, and for example, in addition to manual application using a spatula or the like, a bar coating method, a screen printing method, or the like can be given. Since it is necessary to accurately form an adhesive layer at a predetermined area on the temperature adjustment base section 3, it is preferable to use a screen printing method.

After the application, the electrostatic chuck section 2 and the temperature adjustment base section 3 are superimposed on one another via the organic adhesive having insulation properties. At this time, the power feeding terminal 15*b* and the insulator 17, and the power feeding terminal 31 and the insulator 32, are inserted and fitted into power feeding terminal housing holes which are generated by perforating the holes in the temperature adjustment base section 3 in advance.

Subsequently, depression is performed by applying moderate pressure until the distance between the lower surface of the electrostatic chuck section 2 and the adhesive layer 24 on the upper surface of the temperature adjustment base section 3 reaches the thickness of the spacer 7, and an extruded extra adhesive is removed.

As described above, the electrostatic chuck device 1 of this embodiment is obtained in which the electrostatic chuck section 2 and the temperature adjustment base section 3 which includes the insulating material 4, the heater element 5, and the spacer 7 are joined to and integrated with each other through the organic adhesive layer 6.

In the electrostatic chuck device 1 obtained in this way, the electrostatic chuck section 2 and the temperature adjustment base section 3 which includes the insulating material 4, the heater element 5, and the spacer 7 are bonded to and integrated with each other through the organic adhesive layer 6, and therefore, it is possible to accurately maintain the distance between the heater element 5 and the mounting surface of the electrostatic chuck section 2 and the distance between the heater element 5 and the temperature adjustment base section 3. Therefore, a decrease in uniformity of the in-plane temperature of the plate-like sample due to variation in the thickness of the adhesive layer is eliminated, and it is possible to improve uniformity of the in-plane temperature of the adsorption surface of the plate-like sample W which is placed on the electrostatic chuck section 2.

EXAMPLES

Hereinafter, the invention will be specifically described using an example and a comparative example. However, the invention is not limited by the example.

Example 1

(Manufacturing of Electrostatic Chuck Device)
(Formation of Electrostatic Chuck Section)

The electrostatic chuck section 2 was obtained by joining and integrating the mounting plate 11 and the support plate 12 having a power feeding terminal at the center.

Specifically, the electrostatic chuck section 2 was fabricated, wherein the section has the mounting plate 11 and the support plate 12 shown in FIG. 1, wherein the internal electrode for electrostatic adsorption 13 having a thickness of 15 m is buried between the plates, and the periphery of the electrode is isolated by the insulating material layer 14.

The mounting plate 11 of the electrostatic chuck section 2 was an aluminum oxide-silicon carbide composite sintered body containing 8% by mass of silicon carbide and had a disk shape having a diameter of 310 mm and a thickness of 3 mm.

Further, the support plate 12 was also an aluminum oxide-silicon carbide composite sintered body containing 8% by mass of silicon carbide, similar to the mounting plate 11, and had a disk shape having a diameter of 310 mm and a thickness of 5.0 mm.

Machining was performed on the aforementioned joined body to form a disk shape having a diameter of 298 mm and a thickness of 4.5 mm. Thereafter, a large number of projection portions 16 having a height of 50 μm are formed at the electrostatic adsorption surface of the mounting plate 11 to form an uneven surface, and the top surfaces of the projection portions 16 were used as retaining surfaces for the plate-like sample W. Due to this shape, the joined body has a structure wherein a cooling gas can flow through grooves which are formed between valley portions (places other than the protrusion portions of the adsorption surface) and the plate-like sample W adsorbed electrostatically.

(Formation of Temperature Adjustment Base Section)

The disk-like temperature adjustment base section 3 made of aluminum, which had a diameter of 350 mm and a height of 30 mm, was fabricated by machining. The flow path 21 which circulates a refrigerant was formed in the temperature adjustment base section 3. Furthermore, a plurality of through-holes for a power feeding terminal and an insulator was formed.

(Formation of Spacer)

A sheet-like polyimide resin having a thickness of 75 μm was used as a spacer material. A laminated structure having a thickness of 100 μm was made by performing lamination by using the sheet (height: 75 μm) and an epoxy adhesive sheet (the adhesive layer 24) (height: 25 μm), and this was cut into a square in which each of widths (lengthwise and crosswise) is 2 mm, whereby a laminated body of the spacer 7 and the adhesive layer 24 (the fourth adhesive layer) was fabricated.

(Formation of Heater Element)

A titanium (Ti) thin plate having a thickness of 0.1 mm and a diameter of 300 mm was prepared. The thin plate was bonded on the insulating material 4 (a sheet-like polyimide resin) by using the adhesive 23 (the second adhesive layer). Thereafter, only the titanium (Ti) thin plate was etched by a photolithographic method according to a desired heater pattern described below, whereby the heater element 5 was formed.

The shape of the heater element 5 was made to have a structure, in which four divided element portions are made by dividing the disk-like thin plate to form four concentric circles, that is, dividing the disk-like thin plate such that three doughnut-like element portions having different sizes are formed so that they surround a central circular element portion. In the structure, an input current amount which is inputted to each of these element portions can be adjusted individually.

(Formation of First Adhesive Layer)

The surface of the temperature adjustment base section 3, wherein the surface is located on the electrostatic chuck section 2 side, was degreased and cleaned by using acetone. Thereafter, the adhesive layer 22 (the first adhesive layer) was formed by sticking a sheet-like epoxy adhesive having a sheet shape, which achieves electrical isolation between the base 3 and the heater 5, to a predetermined position of the treated surface.

(Arrangement of Insulating Material)

Subsequently, the insulating material 4 was disposed on the adhesive layer 22. The insulating material 4 and the adhesive layer 22 have almost the same shape. In this way, the combination of the heater element 5, the adhesive, and the insulating material 4 was bonded to the base section 3 by the adhesive layer 22.

(Arrangement of Spacer)

The spacer laminated body which was formed previously by the spacer 7 and the adhesive 24 was bonded to a predetermined position on the heater element 5, whereby the spacer was fixed.

(Formation of Third Adhesive Layer)

Subsequently, an acrylic adhesive was applied onto the obtained temperature adjustment base section 3 by a screen printing method.

(Lamination of Electrostatic Chuck Section and Base Section)

Thereafter, the electrostatic chuck section 2 and the temperature adjustment base section 3 were superimposed on one another with the acrylic adhesive interposed therebetween. After the superimposition, the power feeding terminal 15b and the insulator 17, and the power feeding terminal 31 and the insulator 32, were inserted and fitted into power feeding terminal housing holes perforated in the temperature adjustment base section 3.

Subsequently, depression was performed by applying moderate pressure until the distance between the lower surface of the electrostatic chuck section 2 and the adhesive layer 24 on the temperature adjustment base section 3 reaches the thickness of the spacer 7, and an extruded extra adhesive was removed, whereby an electrostatic chuck device of Example 1 was fabricated.

The Shore hardness of the acrylic adhesive layer formed between the electrostatic chuck section 2 and the temperature adjustment base section 3 was A60.

(Evaluation)

Each of (1) a voltage resistance property and (2) in-plane temperature control and temperature-rising and temperature-lowering characteristics of a silicon wafer of the electrostatic chuck device described above was evaluated.

(1) Voltage Resistance Property

Voltage which is applied between the temperature adjustment base section 3 and the heater element 5 was stepwisely increased from 1 kV, so that the voltage was increased by 1 kV at a time, and the maximum value of the voltage was set to be 10 kV. A leak current in each voltage was measured.

As a result, a leak current in a case where 10 kV as the maximum voltage was applied was 10 μA or less, and excellent voltage resistance property was shown.

(2) In-plane Temperature Control and Temperature-rising and Temperature-lowering Characteristics of Silicon Wafer (Evaluation a)

a. A silicon wafer having a diameter of 300 mm and a thickness of 0.775 mm was electrostatically adsorbed to the mounting surface of the electrostatic chuck section 2. Electric power was applied to each divided element portion of the heater element 5 until the temperature of the center of the silicon wafer reached at 60° C., while cooling water of 20° C. was circulated in the flow path of the temperature adjustment base section 3. The in-plane temperature distribution of the silicon wafer at this time was measured using Thermography TVS-200EX (manufactured by Nippon Avionics Co., Ltd.). The result is shown in FIG. 2.

Figure 2:
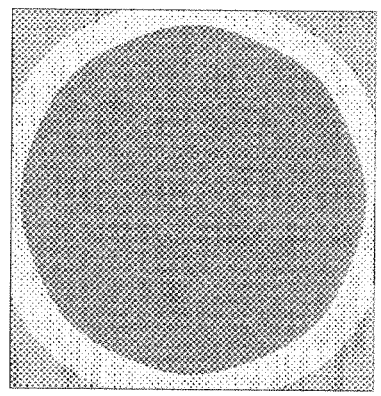
FIG. 2 is a diagram showing in-plane temperature distribution of a silicon wafer when an electrostatic chuck device according to an example of the invention is maintained at 60° C.
Figure 2:
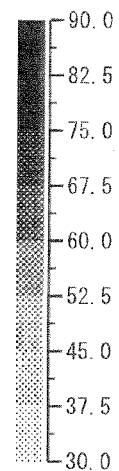

As shown in FIG. 2, it was found that the surface temperature of the silicon wafer was well controlled in a range of 60±1.5° C.

(Evaluation b)

b. Next, in succession to the experiment of Evaluation a, the current amount of the doughnut-shaped divided element portion, which was located as the outermost periphery of the heater element 5, was further increased at a temperature rising rate of 3° C./second, so that the temperature of an outer peripheral portion of the silicon wafer rises from 60° C. to 80° C. The in-plane temperature distribution of the silicon wafer at this time was measured using Thermography TVS-200EX (manufactured by Nippon Avionics Co., Ltd.). The result is shown in FIG. 3.

Figure 3:
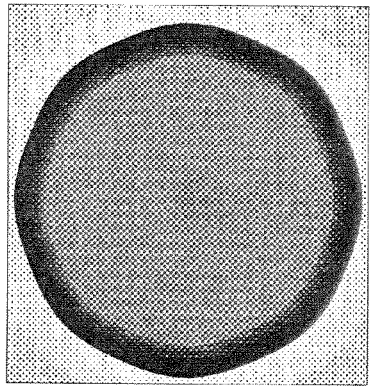
FIG. 3 is a diagram showing in-plane temperature distribution of the silicon wafer at the time of a rise in the temperature of the electrostatic chuck device according to the example of the invention.
Figure 3:
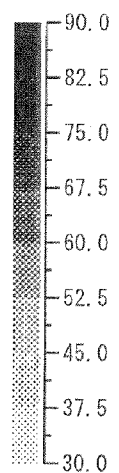

As shown in FIG. 3, it was found that the surface temperature of the outermost periphery of the silicon wafer was well controlled in a range of 80±2.0° C.

(Evaluation c)

c. Further, in succession to the experiment of Evaluation b, only the supply of the electric power to the doughnut-shaped divided element portion, which was located as the outermost periphery of the heater element 5, was stopped, and the temperature of an outer peripheral portion of the silicon wafer was lowered to 40° C. The in-plane temperature distribution of the silicon wafer at this time was measured using Thermography TVS-200EX (manufactured by Nippon Avionics Co., Ltd.). The result is shown in FIG. 4.

Figure 4:
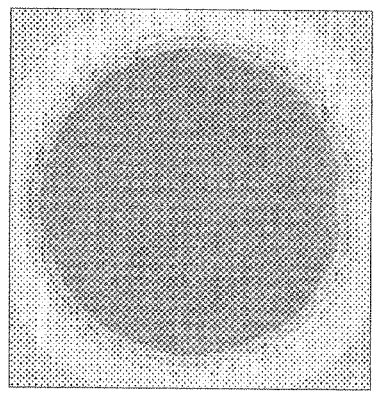
FIG. 4 is a diagram showing in-plane temperature distribution of the silicon wafer at the time of a fall in the temperature of the electrostatic chuck device according to the example of the invention.
Figure 4:
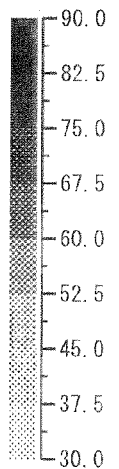

As shown in FIG. 4, it was found that the surface temperature of the outermost periphery of the silicon wafer was well controlled in a range of 40±1.0° C.

Due to the measurement results of Evaluations a to c described above, it was found that the in-plane temperature of the silicon wafer was well controlled in a range of ±2.0° C.

Comparative Example 1

(Manufacturing of Electrostatic Chuck Device)

An electrostatic chuck section and a temperature adjustment base section were manufactured, similar to Example 1. A heater element having the same material and the same shape as that formed in Example 1 was bonded to the surface of a support plate of the electrostatic chuck section via the sheet adhesive 23. The insulating material 4, which was formed of polyimide resin and had the same shape and material as that used in Example 1, was bonded on the surface of the temperature adjustment base section 3 using the sheet-like adhesive 22. In addition, both the electrostatic chuck section and the temperature adjustment base section were superimposed on one another via an acrylic adhesive having Shore hardness of D50 interposed therebetween. An electrostatic chuck device of a comparative example was fabricated according to Example 1 except for the above conditions. Comparative Example 1 is different from Example 1 such that the heater 5 is bonded to the chuck section 2 side, and a heating member is directly formed on a support plate of the electrostatic chuck section.

(Evaluation)

The electrostatic chuck device of the comparative example was evaluated similar to the example.

As a result, with respect to (1) a voltage resistance property, a leak current in a case where voltage of 10 kV or 4 kV was applied was 10 µA or less, and excellent voltage resistance property was shown.

However, with respect to (2) in-plane temperature control and temperature-rising and temperature-lowering characteristics of a silicon wafer, it was found that the in-plane temperature of the silicon wafer was in a range of ±3° C. and uniformity of the in-plane temperature deteriorated.

INDUSTRIAL APPLICABILITY

An electrostatic chuck device is provided in which uniformity of the in-plane temperature of the adsorption surface of a plate-like sample is excellent.

BRIEF DESCRIPTION OF THE REFERENCE SIGNS

1: electrostatic chuck device
2: electrostatic chuck section
3: temperature adjustment base section
4: insulating material
5: heater element
6: organic adhesive layer
7: spacer
11: mounting plate
12: support plate
13: internal electrode for electrostatic adsorption
14: insulating material layer
15, 15a, 15b: power feeding terminal
16: projection portion
17: insulator
21: flow path
22: adhesive layer
23: adhesive layer
24: adhesive layer
31: power feeding terminal
32: insulator
W: plate-like sample

The invention claimed is:

1. An electrostatic chuck device comprising:
an electrostatic chuck section which has a principal surface that is a mounting surface on which a plate-like sample is placed, wherein the electrostatic chuck section comprises an internal electrode for electrostatic adsorption which is incorporated in the section, and
a temperature adjustment base section which adjusts the temperature of the electrostatic chuck section; wherein
a part or all of a surface of the temperature adjustment base section is covered by a sheet-like or film-like insulating material via a first adhesive layer, wherein a planar shape of the first adhesive layer is substantially the same as that of the insulating material, and the surface of the temperature adjustment base section faces to the side where the electrostatic chuck section is located;
a thin plate-like heating member is bonded to a surface of the insulating material via a second adhesive layer, wherein a planar shape of the second adhesive layer is substantially the same as that of the plate-like heating member, and the surface of the insulating material faces to the side where the mounting surface exists; and
the electrostatic chuck section and the temperature adjustment base section to which the insulating material and the heating member are provided are integrated with each other via an organic insulating adhesive layer as a third adhesive layer, which is formed by curing a liquid adhesive.

2. The electrostatic chuck device according to claim 1, wherein the heating member is a thin plate-like heater element made of nonmagnetic metal and having a thickness of 0.2 mm or less.

3. The electrostatic chuck device according to claim 1, wherein variation in the thickness of the insulating material is 10 µm or less.

4. The electrostatic chuck device according to claim 1, wherein the Shore hardness of the organic adhesive layer is A90 or less, and the thermal conductivity of the organic adhesive layer is 0.15 W/mk or more.

5. The electrostatic chuck device according to claim 1, wherein the thickness of the organic adhesive layer is 50 µm or more, and the Young's modulus of a spacer which is disposed between the electrostatic chuck section and the heating member is 10 GPa or less.

6. The electrostatic chuck device according to claim 1, wherein the heat transfer coefficient between the heating member and the temperature adjustment base section is smaller than the heat transfer coefficient between the heating member and the electrostatic chuck section.

7. The electrostatic chuck device according to claim 1, wherein the organic insulating adhesive layer is partially contact with the temperature adjustment base section directly.

8. The electrostatic chuck device according to claim 1, wherein the entire surface of the temperature adjustment base section, which faces to the side where the electrostatic chuck section is located, is covered by the sheet-like or film-like insulating material.

9. The electrostatic chuck device according to claim 1, wherein a spacer is provided between the electrostatic chuck section and the heater element to maintain the distance between the electrostatic chuck section and the heater element at a constant distance.

10. The electrostatic chuck device according to claim 1, wherein the electrostatic chuck device comprises a mounting plate and a support plate which sandwiches the internal electrode, the electrostatic chuck device includes power feeding terminals, which consists of a first power feeding terminal which is fixed in the electrostatic chuck section and a second power feeding terminal which is integrated with the first power feeding terminal and penetrates the insulator and the organic adhesive layer.

11. The electrostatic chuck device according to claim 1, wherein the insulating material is made from at least one resin selected from a group consisting of polyimide resin, silicone resin, epoxy resin and acrylic resin.

12. The electrostatic chuck device according to claim 1, wherein the thickness of the insulating material is in a range of 5 μm to 100 μm.

13. The electrostatic chuck device according to claim 1, wherein the thickness of the first adhesive layer is in a range of 10 μm to 100 μm, the thickness of the second adhesive layer is in a range of 10 μm to 100 μm and the thickness of the third adhesive layer is in a range of 20 μm to 200 μm.

14. The electrostatic chuck device according to claim 1, wherein the first adhesive layer is formed by an adhesive selected from an acrylic adhesive, an epoxy adhesive and a silicone adhesive.

15. The electrostatic chuck device according to claim 1, wherein the second adhesive layer is formed by an adhesive selected from an acrylic adhesive, an epoxy adhesive and a silicone adhesive.

16. The electrostatic chuck device according to claim 1, wherein the third adhesive layer is composed of an acrylic adhesive.

* * * * *